United States Patent [19]

Nukii et al.

[11] Patent Number: 4,514,042
[45] Date of Patent: Apr. 30, 1985

[54] THIN STRUCTURE OF DISPLAY PANEL

[75] Inventors: Takashi Nukii; Shigeo Nakabu, both of Nara; Masaru Iwasaki, Izumisano; Katunobu Awane, Ikoma, all of Japan

[73] Assignee: Sharp Kabushiki Kaisha, Osaka, Japan

[21] Appl. No.: 422,140

[22] Filed: Sep. 23, 1982

[30] Foreign Application Priority Data

Sep. 30, 1981 [JP] Japan .................................. 56-157142
Jun. 30, 1982 [JP] Japan .................................. 57-114463

[51] Int. Cl.³ .............................................. G02F 1/13
[52] U.S. Cl. .................................. 350/331 R; 350/332; 350/334
[58] Field of Search .................... 350/331 R, 332, 333, 350/334

[56] References Cited

U.S. PATENT DOCUMENTS 3,718,842 2/1973 Abbott et al. ................... 350/334 X
4,012,117 3/1977 Lazzery ........................... 350/331 R
4,260,224 4/1981 Takayama ....................... 350/334 X Primary Examiner—John K. Corbin
Assistant Examiner—Richard F. Gallivan
Attorney, Agent, or Firm—Birch, Stewart, Kolasch & Birch

[57] ABSTRACT

A display module comprises a display device for displaying visual information, an electrode disposed on the display device, a circuit board for carrying wiring lines connected to circuit elements for driving the display deivce, and a conductive elastomer body for connecting the wiring lines and the electrode, the conductive elastomer body being placed between the electrode and a curled edge a flange of the circuit board. In a specific form, the display device is a liquid crystal display cell.

7 Claims, 7 Drawing Figures

THIN STRUCTURE OF DISPLAY PANEL

BACKGROUND OF THE INVENTION

The present invention relates to a display module and, more particularly, to the structure of a display panel suitable for a thin display panel of a television.

As an example of a display module, liquid crystal display modules have been developed suitable for providing television displays. The liquid crystal display modules are thin enough to provide portable television sets.

The liquid crystal display modules suitable and applicable to the television sets can be classified into two types:
1. Active matrix display type comprising a liquid crystal cell for providing a display surface, and a silicon substrate for carrying a driver, the silicon substrate being disposed on a rear substrate of the liquid crystal cell.
2. Timesharing operation display type which has evolved from the origin of the conventional electronic calculator display or electronic timepiece display.

The present invention is concerned with the timesharing operation display type.

FIG. 1 shows the structure of a conventional timesharing operation display module. This module comprises a liquid crystal display cell 1, a flexible circuit plate 2, a circuit board 3, circuit components 4, flexible wiring lines 5, and wiring lines 6. The flexible wiring lines 5 on the flexible circuit plate 2 serves to electrically connect the liquid crystal display cell 1, and the circuit components 4 and the wiring lines 6 both on the circuit board 3.

In the above arrangement of the display module of FIG. 1, the display module cannot be thin and compact since the flexible circuit plate 2 is bent to occupy useless space.

Another aspect is that a matrix type display requires 10,000 picture elements to provide television-like pictures. For this requirement, about 100 or more scan lines are required in a simple or a non-multiplex matrix display. However, an exact picture display cannot be expected by using so many scan lines.

Therefore, in the timesharing operation display type, it is urged that the number of lines leading from the liquid crystal display cell should be reduced. For this purpose, the multiplex degree of the timesharing operation is increased. When the multiplex degree is N, the number of scan lines is 1/N times as small as that of the scan lines in the simple or the non-multiplex matrix display, but the number of signal lines is N times as large as that of the signal lines in the simple or the non-multiplex matrix display.

The scan lines are connected to scan electrodes disposed on a rear substrate of the liquid crystal display cell. The signal lines are connected to signal electrodes disposed on a front substrate forming a display surface of the display cell.

Then, increasing the multiplex degree beyond an appropriate degree leads to the problem of handling the many terminals of the signal lines and of generating cross talk. Therefore, the following tetra-multiplexing degree is proposed which appears to be in practice.
The number of picture elements: $120 \times 180$
The picture size: $46.1 \text{ mm} \times 61.4 \text{ mm}$
The number of the scan lines: $120/4 = 30$
The number of the signal lines: 5/mm (200 μm pitch), ($180 \times 4 = 320$ lines in a 61.4 mm interval.)

However, conventional structures of the liquid crystal display module cannot assure the above connection density of the lines, exactly.

SUMMARY OF THE INVENTION

Accordingly, it is an object of the present invention to provide a thin, compact structure of a liquid crystal display panel.

It is another object of the present invention to provide an improved structure of a liquid crystal display panel featured by comprising a conductive elastomer body and a plate-like circuit board.

Briefly described, in accordance with the present invention, a display module comprises display means for displaying visual information, electrode means disposed on the display means, circuit board means for carrying wiring lines connected to circuit means for driving the display means, and conductive elastomer body means for connecting the wiring lines and the electrode means, the conductive elastomer body means being placed between the electrode means and an edge of the circuit board means. In a specific form, the display means is a liquid crystal display cell.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE INVENTION

Figure 1:
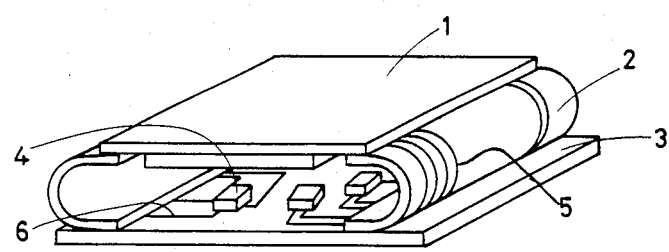
FIG. 1 shows a perspective view of a conventional liquid crystal display module.
Figure 2:
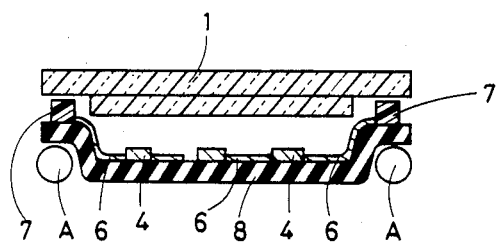
FIG. 2 shows a cross sectional view of a liquid crystal display module according to the present invention.

FIG. 2 shows a cross sectional view of a liquid crystal display module according to the present invention. This module comprises a liquid crystal display cell 1 including two confronting substrates with a liquid crystal material layer disposed therebetween, electrode means disposed on each of the substrates, and sealing means for sealing in the liquid crystal material layer. The display cell 1 is conventional.

The module further comprises circuit components 4, wiring lines 6, electrically conductive elastomer bodies 7 and a circuit board 8. The circuit board 8 is positioned at the rear side of the liquid crystal display cell 1. The surface of the display cell 1, opposed to the circuit board 8, provides a display surface on which visual display is presented.

The circuit board 8 in the configuration of a plate carries the circuit components 4 and the wiring lines 6 on the bottom of the plate within the resulting concavity of the board 8, and supports the electrically conductive elastomer bodies 7 on the edges or flanges of the board 8. The edges or flanges of the board 8 for supporting the conductive elastomer bodies 7 are formed by bending the board 8 to form the plate-like form. The conductive elastomer bodies 7 serve to electrically connect the electrode means of the display cell 1 and the wiring lines 6 on the board 8 in order to drive the cell 1. The wiring lines 6 are aligned, with a small interval on the edges of the board 8, so that the number of lines 6 is numerous. The circuit components 4 are disposed on the bottom of the plate or within the concavity formed by the wiring board 8. The components 4 serve to drive the display cell 1.

This compact structure of the liquid crystal display module according to the present invention enables the thickness of the conductive elastomer body 7, and the clearance between the rear portion of the substrate of the cell 1 and the circuit components 4 to be mininized. Even when a conventional thin conductive elastomer body having a thickness of about 0.5–1.0 mm is applied as the conductive elastomer body 7, the exact connection between the electrode means of the cell 1 and the wiring lines; up to 5 lines per 1 mm; can be realized.

It is urged in the timesharing operation display type that the number of the signal lines to the liquid crystal display cell 1 should be reduced as described in the background of the invention. The possibility that the wiring lines up to 5 per 1 mm can be exactly connected in the structure of FIG. 2 can meet the requirement as described in the background of the invention.

It may be possible for the bent circuit board 8 to be replaced by a flat circuit board free of bent edges to provide a liquid crystal display module comprising a liquid crystal display cell, such as a flat circuit board, electrically conductive elastomers, and circuit components. In such a case, the thickness of the electrically conductive elastomer bodies must be identical with the sum of the thickness of one of the substrates forming the cell, the space between the cell and the circuit components, and the thickness of the circuit components. Since this sum is considerably large, for example, about 3 mm, it is very difficult to find such a thick electrically conductive elastomer bodies whose thickness is identical with this sum, the bodies enabling the exact connection between the wiring lines and the electrode means of the liquid crystal display cell.

This is because, for example, when such thick conductive elastomer bodies are such that gold wires are embedded straight in an insulator body, it is impossible under present techniques for the gold wires to be straight in the insulator body uniformly with an appropriate density of the wires, over such a long length of the insulator body of about 3 mm.

However, according to the bent structure of FIG. 2, the thin conductive elastomer bodies 7, each having a thickness of about 0.5–1.0 mm, can be adapted to exactly provide the electrical connection between the wiring lines 6 and the electrode means of the liquid crystal display cell 1. The thin conductive elastomer bodies 7 used for the structure of FIG. 2 can be such that the gold wires are embedded straight in the insulator body.

Even when additional means for forcing the electrically conductive elastomer bodies 7 upon the cell 1 is required, the additional means may be positioned in spaces A under the bent edges of the board 8. The provision of the forcing means in the spaces A prevents the increase in the total thickness of the liquid crystal display module.

Figure 3:
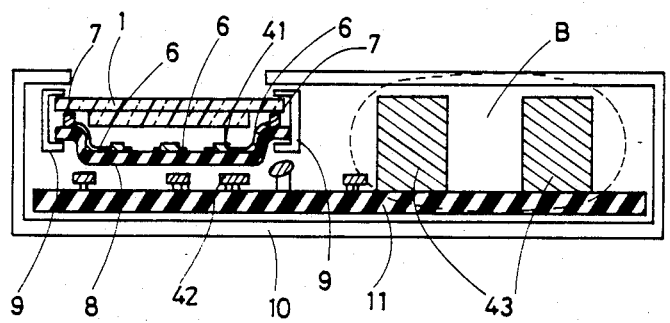
FIG. 3 shows a cross sectional view of another liquid crystal display module according to the present invention.

FIG. 3 shows a cross sectional view of a liquid crystal display module according to another specific form of the present invention. Like elements corresponding to those of FIG. 2 are indicated by like numerals.

The structure of FIG. 3 comprises a binding means 9, a housing 10, a mother circuit board 11, small circuit components 41, and large circuit components 42 and 43, in addition to the elements as shown in FIG. 2.

The binding means 9 is provided for binding the liquid crystal display cell 1 and the bent circuit board 8, gripping the conductive elastomer bodies 7. The binding means 9 may be a spring plate. The small circuit components 41 are disposed on the bent circuit board 8, similar to the structure of FIG. 2. The large circuit components 42 are disposed on the mother circuit board 11 electrically connected to the bent circuit board 8. Other large circuit components 43 which are larger than the circuit components 42 are disposed in a space B on the mother circuit board 11, in order to save space. The large circuit components 43 may be a speaker or a tuner.

It may be possible that the bent circuit board 8 is of any type so long as it may be a circuit board which can be bent. Preferably, the bent circuit board 8 is a multi-layered circuit board comprising a metal base, an insulating layer of an organic material, and a thin film wiring layer.

Such a multi-layered circuit board is disclosed in S. Nakabu et al, U.S. patent application Ser. No. 277,807, filed on June 26, 1981, entitled "Thin Assembly for Wiring Substrate", and assigned to the present assignee. The corresponding W. German Patent Application was filed on June 29, 1981 and was assigned No. P 31 25 518.3.

Figure 4:
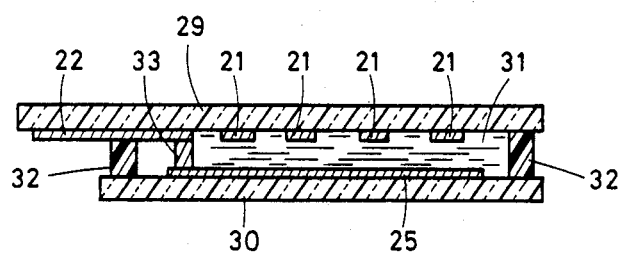
FIGS. 4 and 5 show a cross sectional view of a liquid crystal display cell adapted to the present invention.

In the structures of FIGS. 2 and 3, as FIG. 4 shows, it is required in the liquid crystal display cell that scan electrodes 25 disposed on a rear substrate 30 of the liquid crystal display cell are transferred into a terminal means 22 disposed on a front substrate 29 forming a display surface of the display cell, via a transference member 33 made of Ag paste for bridging the scan electrodes 25 and the terminal means 22. Electrodes 21 disposed on the front substrate 29 are called sinal electrodes. In FIG. 4, 31 indicates a liquid crystal material layer and 32 indicates a sealing member. In a plan view, the respective signal electrodes 21 are crossed with a right angle with the respective scan electrodes 25.

However, the provision of the transference member 33 must enlarge the size of the substrates of the liquid crystal display cell. Due to the difference between thermal expansion coefficients of the sealing member 32 and of the transference member 33, the transference member 33 can be detached from the substrates 29 and 30 at their connection interfaces. Therefore, the connection of the transference member 33 might be damaged, thereby reducing reliability.

Figure 5:
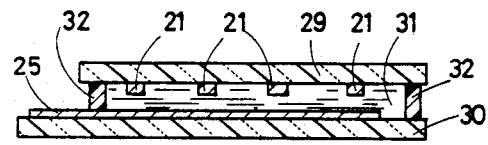

FIG. 5 shows another type of liquid crystal display cell adapted for a further specific form of the present invention. The display cell of FIG. 5 is featured as being free of the transference member 33. Like elements corresponding to those of FIG. 4 are indicated by like numerals.

On the rear substrate 30, the scan electrodes 25 is extended out of the sealed cell of the liquid crystal display cell. Along a plane normal to the surface of the drawing of FIG. 5, the signal electrodes 21 are extended, on the front substrate 29, out of the sealed cell of the liquid crystal display cell.

Figure 6:
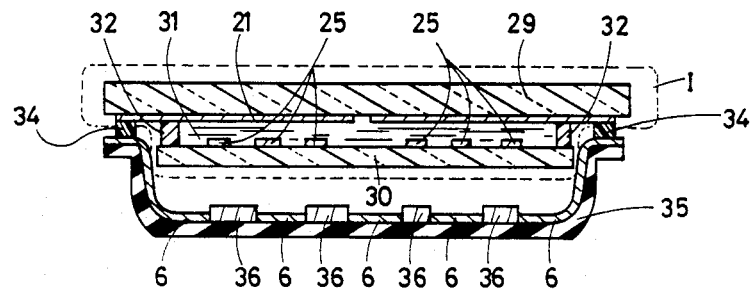
FIG. 6 shows a cross sectional view along a plane parallel to a side of a further liquid crystal display module according to the present invention.
Figure 7:
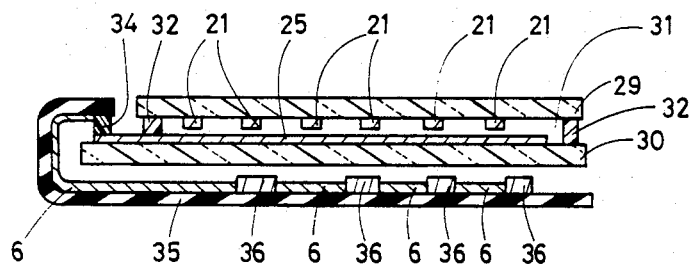
FIG. 7 shows a cross sectional view, along another plane parallel to another side of the cell which is normal to the side related to FIG. 6, of the further liquid crystal display module as shown in FIG. 6.

FIGS. 6 and 7 show cross sectional views of the liquid crystal display module according to a further specific form of the present invention. The display module as shown in FIGS. 6 and 7 comprises the display cell as shown in FIG. 5. FIG. 6 is a cross sectional view along a plane parallel to a side of the cell and FIG. 7 is a view along another plane parallel to another side of the cell which is normal to the side related to FIG. 6. Like elements corresponding to those of FIG. 5 are indicated by like numerals.

With reference to FIG. 6, a circuit board 35 is provided for supporting the wiring lines 6 and circuit components 36 on the bottom of the concavity of the board 35, and electrically conductive elastomer bodies 34 on the bent edges or the flanges of the board 35. The circuit board 35 is related to the circuit board 8 of FIG. 2. The elastomer bodies 34 are related to the elastomer bodies 7 of FIG. 2.

The circuit board 35 is positioned behind the liquid crystal display cell I. The electrically conductive elastomer bodies 34 serve to electrically connect the wiring lines 6 on the board 35, and the signal electrodes 21 on the front substrate of the display cell I. The structure of FIG. 6 is identical to that of FIG. 2.

With reference to FIG. 7, the electrically conductive elastomer body 34 is secured between the scan electrodes 25 and the inside of the curled edge of the circuit board 35. The elastomer body 34 serves to electrically connect the scanning electrodes 25 on the rear substrate 30 of the display cell I, and the wiring lines 6 on the circuit board 35. The circuit board 35 is curled so that the curled edge confronts the scan electrode 25 on the rear substrate 30. The circuit components 36 for driving the display cell I are disposed on the flat part of the board 35. The circuit components 36 may be an integrated circuit (IC).

In a form alternative to the forms of FIGS. 6 and 7, it may be possible that the scan electrodes are disposed on the front substrate of the display cell and the circuit board is upright and bent to support the elastomer body for connecting the scan electrodes and the wiring lines on the board. In such a case, the signal electrodes are disposed on the rear substrate of the display cell and the two edges of the circuit board are curled to confront the signal electrodes on the rear substrates.

However, the structures of FIGS. 6 and 7 are preferable to the above possible case for the following reason. The pitch of the scan electrodes is longer than that of the signal electrodes. After the signal lines on the circuit board 35 are exactly connected to the signal electrodes 21 as shown in FIG. 6, the scan lines on the circuit board 35 can be easily and automatically connected to the scan electrodes 25, exactly, as shown in FIG. 7.

The gist of the present invention is applicable to any type of flat matrix display panel including a liquid crystal dot matrix display, a plasma display and an electroluminescent display and the like, in addition to the above described liquid crystal display panel.

While only certain embodiments of the present invention have been described, it will be apparent to those skilled in the art that various changes and modifications may be made therein without departing from the spirit and scope of the invention as claimed.

What is claimed is:

1. A display module comprising:
   display means for displaying visual information;
   electrode means disposed on said display means;
   first circuit board means shaped as a plate for carrying wiring lines connected to a first circuit means for driving said display means said plate comprising a curled flange portion rising above a bottom portion; and
   electrically conductive elastomer body means for connecting said wiring lines and said electrode means;
   said conductive elastomer body means being placed between said electrode means and said flange portion of said circuit board means and said first circuit means is placed on said bottom portion of said circuit board means.

2. The module of claim 1, wherein said electrode means comprises a first electrode means disposed on a first substrate of said display means, and a second electrode means disposed on a second substrate of said display means wherein:
   said electrically conductive elastomer body is placed between said first electrode means and said flange of said plate shaped circuit board.

3. The module of claim 1, wherein said display means comprises a liquid crystal display.

4. The module of claim 1, wherein said electrically conductive elastomer body means is about 0.5–1.0 mm thick.

5. The module of claim 1, further comprising binding means for binding said display means and said first circuit board means so as to force said conductive elastomer body means into contact with said electrode means on said display means and said first circuit means on said first circuit board means.

6. The module of claim 1, further comprising a second circuit board means for supporting second wiring lines and second circuit means both connected to said first circuit means disposed on said first circuit board means.

7. A display module comprising in combination a display means for displaying visual information, electrode means disposed on said display means, said electrode means comprising a first electrode means disposed on a first substrate of said display means and a second electrode means disposed on a second substrate of said display means, a first circuit board means having a flat shape carrying wiring lines connected to a first circuit means for driving said display means and electrically conductive elastomer body means for connecting said first circuit means and said electrode means, at least one edge of said circuit board means being curled so that said electrically conductive elastomer body means is placed between said curled edge and said second electrode means.

* * * * *